United States Patent [19]
Cho et al.

[11] Patent Number: 6,052,001
[45] Date of Patent: Apr. 18, 2000

[54] METHOD AND CIRCUIT FOR VARYING TRANSCONDUCTANCE AND VARIABLE BANDWIDTH FILTER AND VARIABLE GAIN AMPLIFIER USING THE SAME

[75] Inventors: Gea-Ok Cho; Cheon-Sup Kim, both of Suwon, DPR of Korea

[73] Assignee: Samsung Electronics Co., Ltd., Kyungki-do, Rep. of Korea

[21] Appl. No.: 09/004,130

[22] Filed: Jan. 6, 1998

[30] Foreign Application Priority Data

May 9, 1997 [KP] DPR of Korea .................. 97-17845

[51] Int. Cl.[7] ............................. H03K 5/00; H03F 3/191
[52] U.S. Cl. .................... 327/103; 327/553; 327/561; 330/303; 330/284; 330/254
[58] Field of Search ........................ 327/306, 308, 327/552, 558, 553, 361, 561, 560; 333/81 R; 330/283, 144, 284, 303, 254

[56] References Cited

U.S. PATENT DOCUMENTS

| | | | |
|---|---|---|---|
| 4,009,400 | 2/1977 | Harris et al. | 327/553 |
| 5,278,700 | 1/1994 | Sutliff et al. | 360/46 |
| 5,510,738 | 4/1996 | Gorecki et al. | 327/103 |
| 5,872,475 | 2/1999 | Otaka | 327/308 |

OTHER PUBLICATIONS

Kim et al., "Active RC . . . Controls", J. Korean Inst. Electron Engineering, Vo. 12, No. 6, Feb. 1976).

*Primary Examiner*—Dinh T. Le
*Attorney, Agent, or Firm*—Sughrue, Mion, Zinn, Macpeak & Seas, PLLC

[57] ABSTRACT

A variable transconductance method and circuit is disclosed along with a filter and an amplifier using the same. An output transconductance is set by selectively adding at least two transconductances which are set according to a select signal for variably selecting an output transconductance.

8 Claims, 2 Drawing Sheets

METHOD AND CIRCUIT FOR VARYING TRANSCONDUCTANCE AND VARIABLE BANDWIDTH FILTER AND VARIABLE GAIN AMPLIFIER USING THE SAME

BACKGROUND OF THE INVENTION

1. Field of the Invention

The present invention relates to a transconductor and, more particularly, to a method and circuit for varying transconductance, and a filter and an amplifier using the same.

2. Description of the Related Art

Recently, an optical disk reproducing apparatus for reproducing a signal from a disk, such as a compact disk (CD), a digital video disk (DVD), etc., has shown a tendency toward a high reproducing speed. In the optical disk reproducing apparatus of a low reproducing speed, such as normal, double, quadruple or octuple speed, the frequency of an input signal picked up from the disk is low. Accordingly, there is no need to use an equalizer. However, in the optical disk reproducing apparatus of a high reproducing speed, the frequency characteristic is very important. In particular, as the reproducing speed increases, the frequency of the input signal becomes high. Since a level of the input signal picked up from the disk becomes low at higher frequencies, it is necessary to install the equalizer to boost the high frequency signal. In the optical disk reproducing apparatus of a DVD type, a signal received at a pickup has different levels according to frequency and these levels depend on the kind of disk and the kind of pickup. In order to appropriately process the input signal, a high performance equalizer should be used.

Since there are many kinds of pickups and disks used in the optical disk reproducing apparatus, the frequency characteristic of the equalizer, i.e., the frequency characteristic of a filter utilized in the equalizer should be set according to the kind of disk and the kind of pickup. However, if each frequency characteristic corresponding to the kind of disk and the kind of pickup used in the optical disk reproducing apparatus must be provided by additional filters, and if one filter is selectively used as the need arises, the construction of. the equalizer is complicated and the stability thereof is degraded.

Meanwhile, a transconductor generates an output current which is proportional to an input signal voltage. Assuming that the input signal voltage is Vin and the output current is i, the output current i=gm×Vin (where gm is a transconductance of the transconductor). If a capacitor is connected to the output of the transconductor, the characteristic of an output signal voltage Vo for the input signal voltage Vin can be expressed as follows: Vo/Vin=gm×(1/sC) (where C is a capacitance of the capacitor and s is the Laplace variable). The combination of the transconductor and the capacitor can be used in a filter. The characteristic of such a filter is represented by gm×C. The transconductor may also be used in an amplifier.

If the filter using the combination of the transconductor and the capacitor is utilized in the equalizer of the optical disk reproducing apparatus, the frequency characteristic may be varied according to the transconductance. Therefore, the frequency characteristic corresponding to the kind of disk and the kind of pickup can be set by varying the transconductance of the filter In other words, if only a transconductor device having different output transconductances is used in the filter then different frequency characteristics can be provided without providing several separate filters.

If the transconductance varies whenever the disk and the pickup changes, the frequency characteristic of the filter can be variably set even if only one set of filter components is used. To variably set the frequency characteristic of the filter simply and stably, a technique is needed for simply and stably varying the transconductance. Such a technique would also be applicable for setting a variable gain of the amplifier.

As described above, there is need for an apparatus and method for variably setting the frequency characteristic of a filter or the gain of an amplifier simply and stably. To this end, the present invention relates to a technique for simply and stably varying the transconductance of the transconductor used in an amplifier and a filter.

SUMMARY OF THE INVENTION

It is an object of the invention to provide a method and circuit which can simply and stably vary transconductance.

It is another object of the invention to provide a variable bandwidth filter which can variably set a frequency characteristic simply and stably.

It is still another object of the invention to provide a variable gain amplifier which can variably set its gain.

According to the present invention, an output transconductance is set by selectively adding at least two transconductances which are set according to a select signal for variably selecting the output transconductance.

BRIEF DESCRIPTION OF THE DRAWINGS

The above and other objects, features and advantages of the invention will be more apparent from the following detailed description taken with the attached drawings in which.

DETAILED DESCRIPTION OF THE PREFERRED EMBODIMENT

In the following description, numerous specific details, such as circuit constructions, elements, etc., are set forth to provide a more thorough description of the present invention. It will be apparent, however, to one skilled in the art, that the present invention may be practiced without these specific details. In other instances, well known features and constructions are not described in detail so as not to obscure the present invention.

Figure 1:
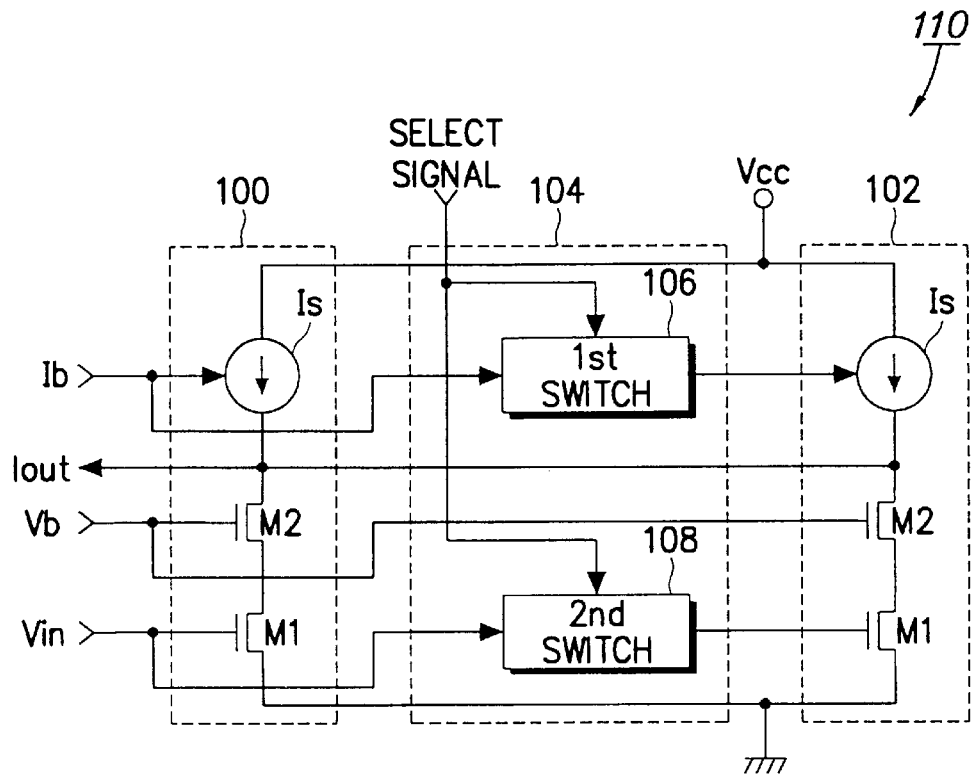
FIG. 1 illustrates a variable transconductance circuit according to the present invention.

FIG. 1 illustrates a variable transconductance circuit 110 for variably selecting one of two transconductances. The variable transconductance circuit 110 of FIG. 1 includes first and second transconductance cells 100 and 102 and a selector circuit 104. The two transconductance cells 100 and 102 have the same construction and generate substantially the same output transconductance.

Output terminals of the first and second transconductance cells 100 and 102 are commonly connected to each other. An input signal voltage Vin, a current bias Ib and a bias voltage Vb are directly applied to the first transconductance cell 100.

Although the bias voltage Vb is also directly applied to the second transconductance cell 102, the input signal voltage Vin and the current bias Ib are selectively applied to the second transconductance cell 102 by the selector circuit 104. Each of the first and second transconductance cells 100 and 102 has one current source Is and two MOS (Metal Oxide Semiconductor) transistors M1 and M2. The current source Is is connected between a power voltage Vcc and the output terminal. The MOS transistors M1 and M2 are serially connected between the output terminal and a ground terminal. The input signal voltage Vin is applied to the gate electrode of the MOS transistor M1, and the bias voltage Vb is applied to the gate electrode of the MOS transistor M2. The voltage Vin is the input signal voltage of an apparatus to which the variable transconductance circuit of FIG. 1 is applied. In other words, Vin is the input signal voltage of a filter or an amplifier. The current bias Ib sets the current of the current source Is. The bias voltage Vb is a voltage for tuning an output transconductance of each of the first and second transconductance cells 100 and 102.

If the input signal voltage Vin is applied to the first transconductance cell 100 and current bias Ib and the bias voltage Vb are also applied, the first transconductance cell 100 generates a current which is proportional to the input signal voltage Vin according to a set transconductance. Similarly, if the input signal voltage Vin is applied to the second transconductance cell 102 and the current bias Ib and bias voltage Vb are applied through the selector circuit 104, the second transconductance cell 102 generates a current which is proportional to the input signal voltage Vin according to the set transconductance.

The select circuit 104 having first and second switches 106 and 108 is connected to the second transconductance cell 102 and selectively operates the second transconductance cell .102 according to a select signal. The first switch 106 switches on or off a supply path of the current bias Ib to the current source Is of the second transconductance cell 102 according to the select signal. The second switch 108, interlocked with the first switch 106, switches on or off a supply path of the input signal voltage Vin to the gate electrode of the MOS transistor M1 of the second transconductance cell 102 according to the select signal. The select signal is a signal for selecting one of two variable output transconductances. The select signal is applied as one form of logic "0" and "1". The first and second switches 106 and 108 are switched on or off by the select signal. For example, if the select signal of logic "0" is applied, the first and second switches 106 and 108 are switched on, and if the select signal of logic "1" is applied, they are switched off.

If the first and second switches 106 and 108 are switched off by the select signal, the current bias Ib and the input signal voltage Vin are not applied to the second transconductance cell 102. Therefore, only the first transconductance cell 100 out of the two transconductance cells 100 and 102 is operational. In this case, an output current Iout depends on the transconductance of the first transconductance cell 100. If both the first and second switches 106 and 108 are switched on, the current bias Ib and the input signal voltage Vin are applied to the second transconductance cell 102 as well as the first transconductance cell 100. Therefore, the first and second transconductance cells 100 and 102 are both operational. Since the output terminals of the transconductance cells 100 and 102 are commonly connected to each other, the output current Iout is a sum of the transconductances of the first and second transconductance cells 100 and 102 when both cells are operational. If the transconductance of each of the first and second transconductance cells 100 and 102 is gm, the output transconductance is 2gm. If the output current of each of the first and second transconductance cells 100 and 102 is Io, the final output current Iout is 2Io.

Consequently, the output transconductance can be variably set to one of two values by current switching for selectively operating the second transconductance cell 102 by the selector circuit 104. In this case, the output transconductance can be simply varied by changing only the state of the select signal and stably varied by the current switching. Moreover, the characteristic of the transconductance cell can be accurately tuned by the bias voltage Vb applied to the MOS transistor M2. That is, since the current is adjusted by controlling the bias voltage Vb, the output transconductance can be accurately tuned.

In order to set the transconductance to more than two values, additional transconductance cells and selector circuits may be installed. For example, if four variable transconductance values are desired, a pair of the transconductance cells and a pair of selector circuits are additionally connected to the circuit of FIG. 1.

Figure 2:
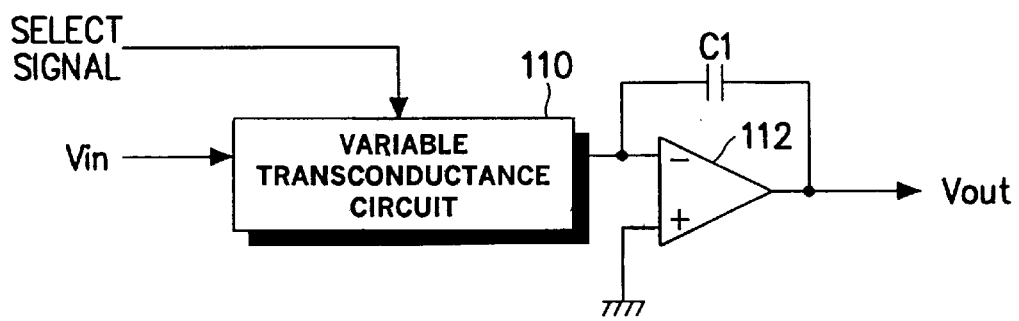
FIG. 2 illustrates a variable bandwidth filter according to the present invention.

FIG. 2 illustrates a variable bandwidth filter according to the present invention. In FIG. 2, the variable transconductance circuit of FIG. 1 is applied to a low pass filter. The output current Iout shown in FIG. 1 is supplied to an inverting input terminal (−) of an operational amplifier 112. A noninverting input terminal (+) of the operational amplifier 112 is grounded. A capacitor C1 is connected between the inverting input terminal (−) and an output terminal of the operational amplifier 112. The variable transconductance circuit 110 has an output transconductance varying according to the select signal. Since the transconductance is variably set according to the select signal, the select signal also serves as a signal for variably selecting the frequency characteristic of the low pass filter.

The frequency characteristic of the low pass filter shown in FIG. 2 is determined by the output transconductance of the variable transconductance circuit 110 and the capacitance of the capacitor C1. In this case, since the capacitance of the capacitor C1 is a fixed value and the transconductance is varied by the select signal, the frequency characteristic, that is, a cutoff frequency band, of the low pass filter is varied in accordance with the transconductance. Moreover, the frequency characteristic can be accurately tuned by the bias voltage Vb applied to the MOS transistor M2. In other words, since the output current is adjusted by controlling the bias voltage Vb, the frequency characteristic can be accurately tuned. According to an experimental result of the present invention, the variable range for the frequency characteristic obtained by controlling the bias voltage Vb varies by about ±50% when the low pass filter is applied to the DVD of normal or double reproducing speed.

Therefore, if the low pass filter of FIG. 2 is applied to the equalizer of the optical disk reproducing apparatus, the frequency characteristic can be variably set according to the kind of disk. By using the variable transconductance circuit 110, the frequency characteristic of the filter is variably set in a simple and stable manner. Hence, if the present invention is applied to the equalizer of the optical disk reproducing apparatus, since the frequency characteristic can vary according to the characteristic difference of the disk and pickup, the distortion of a reproduced signal can be minimized. Further, since the frequency characteristic is simply set by current switching, it is possible to easily design the equalizer to correspond to high frequency reproduction. Hence, the present invention can be efficiently applied to the optical disk reproducing apparatus showing a tendency toward a high reproducing speed.

Figure 3:
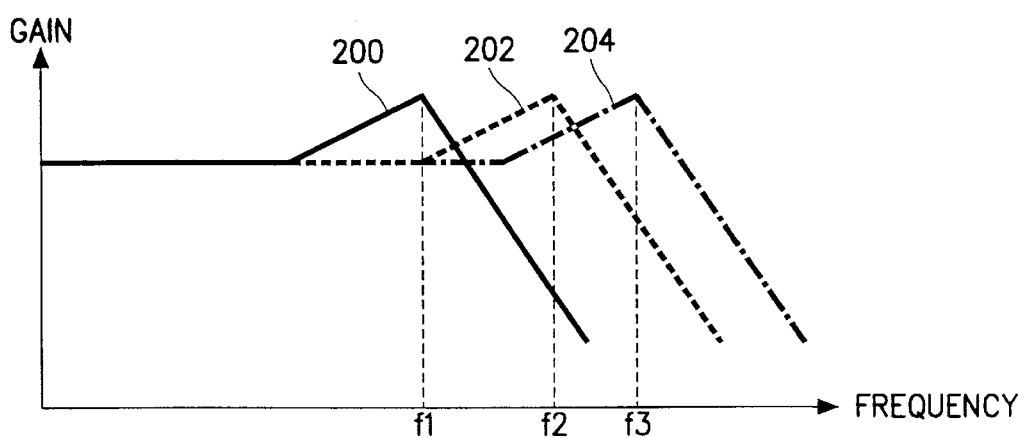
FIG. 3 illustrates frequency characteristics when the variable transconductance circuit of FIG. 1 is applied to an equalizer of an optical disk reproducing apparatus.

FIG. 3 illustrates frequency characteristics when the variable transconductance circuit 110 is applied to the equalizer of the optical disk reproducing apparatus. Reference numbers 200, 202 and 204 show the variable setting of frequency characteristics for boosting the input signal when the DVD is normal speed, double speed and quadruple speed, respectively.

Figure 4:
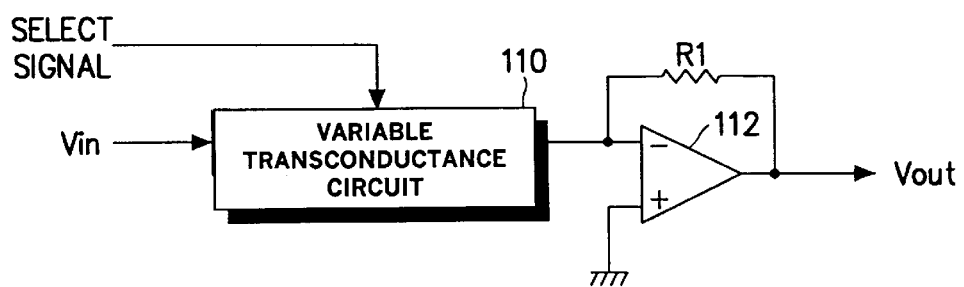
FIG. 4 illustrates a variable gain amplifier according to the present invention.

FIG. 4 illustrates a variable gain amplifier according to the present invention. In FIG. 4, the variable transconductance circuit 110 of FIG. 1 is applied to the amplifier. The output current Iout shown in FIG. 1 is supplied to the inverting input terminal (−) of the operational amplifier 112. The noninverting input terminal (+) of the operational amplifier 112 is grounded. A resistor R1 is connected between the inverting input terminal (−) and the output terminal of the operational amplifier 112. The variable transconductance circuit 110 has an output transconductance varying according to the select signal. Since the transconductance is variably set according to the select signal, the select signal varies the gain of the amplifier.

The gain characteristic of the variable gain amplifier of FIG. 4 is determined by the output transconductance of the variable transconductance circuit 110 and the resistance of the resistor R1. In this case, since the resistance of the resistor R1 is fixed and the transconductance is varied by the select signal, the gain of the variable gain amplifier is varied in accordance with the transconductance. The gain of the amplifier can be accurately tuned by the bias voltage Vb applied to the MOS transistor M2. That is, since the current is adjusted by controlling the bias voltage Vb, the gain can be accurately tuned.

Since the gain of the amplifier is simply and stably set by the variable transconductance circuit 110, the present invention may be efficiently applied to an apparatus requiring a gain variation.

As noted previously, the present invention can variably set the transconductance and the frequency characteristic of a filter simply and stably. Therefore, the present invention may be efficiently applied to the optical disk reproducing apparatus. Moreover, the gain of the amplifier can also be variably set simply and stably.

While there is shown and described a preferred embodiment of the invention, it will be apparent to those skilled in the art that various changes and modifications may be made therein without departing from the spirit of the invention as defined in the appended claims and that it may be possible, for example, to variably set the transconductance to a plurality of values.

What is claimed is:

1. The variable transconductance circuit comprising:
at least first and second transconductance cells, each cell having a commonly connected output terminal and a respective transconductance value, wherein each respective cell operably generates a current which is proportional to an input signal voltage according to the respective transconductance value; and
at least one selector circuit connected to a corresponding transconductance cell, wherein said selector circuit operates at least one of said first and second transconductance cells according to a select signal received by said selector circuit for variably establishing an effective transconductance of said variable transconductance circuit appearing at said commonly connected output terminal;
wherein each of said transconductance cells comprises:
a current source for supplying a constant current; and
a first MOS transistor connected between said current source and a ground terminal, for receiving said input signal voltage through a gate electrode; and
wherein said selector circuit comprises:
a first switch for switching on or off a supply path of an externally supplied current bias to the current source of said corresponding transconductance cell according to said select signal; and
a second switch for switching on or off a supply path of said input signal voltage to the gate electrode of said first MOS transistor of said corresponding transconductance cell according to said select signal, said second switch being interlocked with said first switch.

2. The variable transconductance circuit as claimed in claim 1, wherein each of said transconductance cells further comprises a second MOS transistor connected between said current source and said first MOS transistor, for receiving a bias voltage through a gate electrode of the second MOS transistor to tune the transconductance appearing at said commonly connected output terminal.

3. The variable transconductance circuit of claim 2, wherein the set transconductances of each transconductance cell are substantially the same.

4. The variable bandwidth filter comprising:
at least first and second transconductance cells, each cell having a commonly connected output terminal and a respective transconductance value, wherein each respective cell generates a current which is proportional to an input signal voltage according to the respective transconductance value;
an operational amplifier having an inverting input terminal connected to the commonly connected output terminal of said transconductance cells;
a capacitor connected between said inverting input terminal and an output terminal of said operational amplifier; and
at least one selector circuit connected to a corresponding transconductance cell, wherein said selector circuit sets a bandwidth of the variable bandwidth filter by selectively operating at least one of said first and second transconductance cells according to a select signal received by said selector circuit for variably establishing said bandwidth;
wherein each of said transconductance cells comprises:
a current source connected between a power terminal and said common output terminal; and
a first MOS transistor connected between said current source and a ground terminal, for receiving said input signal voltage through a gate electrode;
wherein said selector circuit comprises:
a first switch for switching on or off a supply path of an externally supplied current bias to the current source of said corresponding transconductance cell according to said select signal; and
a second switch for switching on or off a supply path of said input signal voltage to the gate electrode of said first MOS transistor of said corresponding transconductance cell according to said select signal, said second switch being interlocked with said first switch.

5. The variable bandwidth filter as claimed in claim 4, wherein each of said transconductance cells further comprises a second MOS transistor connected between said current source and said first MOS transistor, for receiving a bias voltage through its gate electrode to tune said frequency characteristic.

6. The variable bandwidth filter of claim 5, wherein the respective transconductance values of each transconductance cell substantially the same.

7. A variable gain amplifier, comprising:

at least first and second transconductance cells, each cell having a commonly connected output terminal and a respective transconductance value, wherein each cell generates a current which is proportional to an input signal voltage according to the respective transconductance value;

an operational amplifier having an inverting input terminal connected to the commonly connected output terminal of said transconductance cells;

a resistor connected between said inverting input terminal and an output terminal of said operational amplifier; and at least one selector circuit connected to a corresponding transconductance cell, wherein said selector circuit sets a gain of the variable gain amplifier by selectively operating at least one of said first and second transconductance cells according to a select signal for variably establishing said gain;

wherein each of said transconductance cells comprises:

a current source connected between a power terminal and said common output terminal; and a first MOS transistor connected between said current source and a ground terminal, for receiving said input signal voltage through a gate electrode;

wherein said selector circuit comprises:

a first switch for switching on or off a supply path of an externally supplied current bias to the current source of said corresponding transconductance cell according to said select signal; and a second switch for switching on or off a supply path of said input signal voltage to the gate electrode of said first MOS transistor of said corresponding transconductance cell according to said select signal, said second switch being interlocked with said first switch.

8. The variable gain amplifier as claimed in claim 7, wherein each of said transconductance cells further comprises a second MOS transistor connected between said current source and said first MOS transistor, for receiving a bias voltage through a gate electrode to tune said gain.

* * * * *